(12) United States Patent
Mochizuki

(10) Patent No.: US 8,462,883 B2
(45) Date of Patent: Jun. 11, 2013

(54) TRANSMISSION APPARATUS AND METHOD OF CONTROLLING THE SAME

(75) Inventor: Takuji Mochizuki, Tokyo (JP)

(73) Assignee: NEC Corporation, Tokyo (JP)

( * ) Notice: Subject to any disclaimer, the term of this patent is extended or adjusted under 35 U.S.C. 154(b) by 228 days.

(21) Appl. No.: 13/103,910

(22) Filed: May 9, 2011

(65) Prior Publication Data

US 2011/0280338 A1 Nov. 17, 2011

(30) Foreign Application Priority Data

May 14, 2010 (JP) ................. 2010-111855

(51) Int. Cl.
*H04L 25/49* (2006.01)

(52) U.S. Cl.
USPC ........................................ 375/297

(58) Field of Classification Search
None
See application file for complete search history.

(56) References Cited

U.S. PATENT DOCUMENTS

| | | | | |
|---|---|---|---|---|
| 3,643,161 A * | 2/1972 | Swanson | | 375/238 |
| 5,196,808 A * | 3/1993 | Pickett et al. | | 330/298 |
| 5,955,921 A * | 9/1999 | Ide et al. | | 330/254 |
| 7,532,680 B2 * | 5/2009 | Vayrynen et al. | | 375/295 |
| 7,570,931 B2 * | 8/2009 | McCallister et al. | | 455/126 |
| 8,094,691 B2 * | 1/2012 | Harter et al. | | 372/25 |
| 2002/0160804 A1 * | 10/2002 | Bogner et al. | | 455/522 |
| 2004/0043728 A1 * | 3/2004 | Rozenblit et al. | | 455/118 |
| 2004/0198301 A1 * | 10/2004 | Rozenblit et al. | | 455/343.1 |
| 2004/0264091 A1 * | 12/2004 | Ishida | | 361/93.1 |
| 2006/0030283 A1 * | 2/2006 | Katagishi et al. | | 455/130 |
| 2006/0040625 A1 * | 2/2006 | Saito et al. | | 455/127.1 |
| 2006/0222061 A1 * | 10/2006 | Kojima | | 375/219 |
| 2007/0049225 A1 * | 3/2007 | Yoon | | 455/217 |
| 2010/0171427 A1 * | 7/2010 | Kirchmeier et al. | | 315/111.21 |
| 2011/0043956 A1 * | 2/2011 | Su et al. | | 361/86 |
| 2012/0212803 A1 * | 8/2012 | Nati et al. | | 359/341.3 |

FOREIGN PATENT DOCUMENTS

| | | |
|---|---|---|
| JP | 6-152265 A | 5/1994 |
| JP | 11-251935 A | 9/1999 |
| JP | 11-284522 A | 10/1999 |
| JP | 2000341145 A | 12/2000 |
| JP | 2001168740 A | 6/2001 |
| JP | 2005051349 A | 2/2005 |
| JP | 2005191791 A | 7/2005 |

\* cited by examiner

*Primary Examiner* — Daniel Washburn
*Assistant Examiner* — Bahman Badipour

(57) ABSTRACT

A transmission apparatus according to the present invention includes: a baseband signal generator; a local oscillator; a modulator that generates a modulation signal by multiplying a baseband signal by a carrier wave signal including a local oscillation frequency; a power amplifier that amplifies the modulation signal; a filter having a pass bandwidth that is narrower than a frequency bandwidth that can be set or emerge in the local oscillator and removes at least a part of unwanted component generated in association with the modulation signal that is amplified; and a frequency bandwidth inside/outside decision unit that decides that the local oscillation frequency is out of a predetermined bandwidth. The transmission apparatus controls one of the baseband signal generator and the local oscillator to reduce the modulation signal when it is decided by the frequency bandwidth inside/outside decision unit that the local oscillation frequency is out of the predetermined bandwidth.

10 Claims, 12 Drawing Sheets

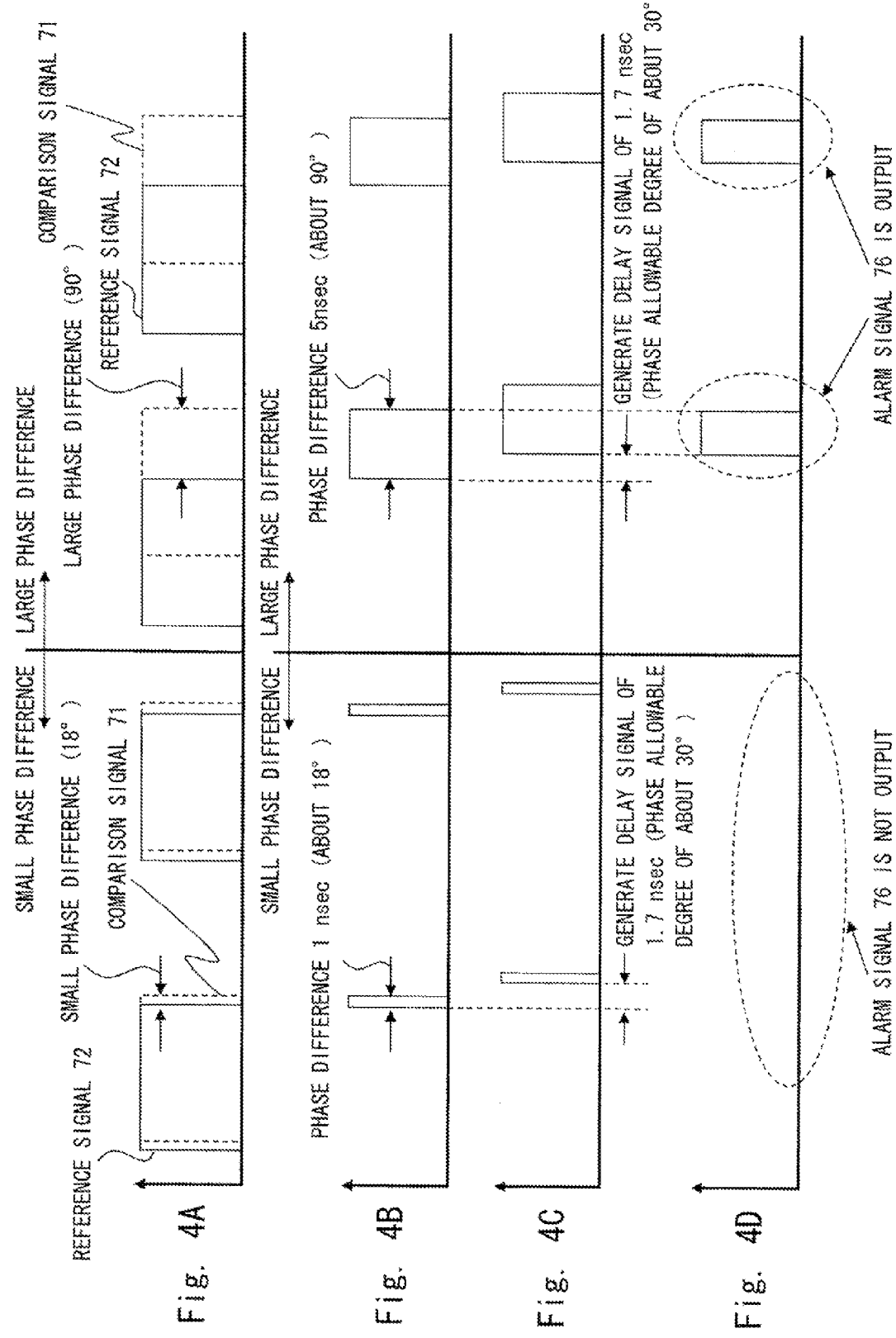

TRANSMISSION APPARATUS AND METHOD OF CONTROLLING THE SAME

INCORPORATION BY REFERENCE

This application is based upon and claims the benefit of priority from Japanese patent application No. 2010-111855, filed on May 14, 2010, the disclosure of which is incorporated herein in its entirety by reference.

BACKGROUND OF THE INVENTION

1. Technical Field

The present invention relates to a transmission apparatus and a method of controlling the same, and more specifically, to a transmission apparatus and a method of controlling the same that are capable of protecting a power amplifier included in the transmission apparatus from a reflected wave.

2. Background Art

A transmission apparatus used in a radio system and the like includes a power amplifier of high-frequency and high-output. This power amplifier may be destroyed by a reflected wave counterflowing from a circuit such as a filter provided in an output side of the power amplifier, for example. Related art techniques for solving such a problem include the following techniques.

The first technique is the one for detecting, in an output side of a power amplifier, a reflected wave or return loss (voltage standing wave ratio) that is caused by inconsistency in the output side of the power amplifier, thereby preventing the reflected wave from counterflowing and the power amplifier from being destroyed using a protection circuit when the detection result is beyond an acceptable level.

The second technique is the one for directly detecting whether a transmission frequency of the transmission apparatus is within a predetermined bandwidth, and for example, interrupting a power supply of the power amplifier when the transmission frequency is out of the predetermined bandwidth, thereby preventing the power amplifier from being destroyed.

The first technique will be described first. FIG. 9 is a circuit diagram showing a protection circuit of a power amplifier disclosed in Japanese Unexamined Patent Application Publication No. 2005-191791. In the protection circuit of the power amplifier shown in FIG. 9, a directional coupler 104 is provided in an output side of a power amplifier 102, and an increase in the reflected wave power from a load is detected in a power detector 106 through the directional coupler 104. Then, by supplying a detection signal of the power detector 106 to a power supply voltage control circuit 109, the power supply voltage supplied to the power amplifier 102 is gradually reduced. Hence, the power supply voltage supplied to the power amplifier 102 can be gradually reduced as the power amplifier 102 approaches the breakdown condition. Hence, it is possible to prevent the power amplifier 102 from being destroyed due to the change of operating conditions of the power amplifier such as load variations.

Further, in a transmission circuit disclosed in Japanese Unexamined Patent Application Publication No. 2000-341145, a directional coupler is provided between a power amplifier and an antenna. Then a reflected wave that reflects in the side of the power amplifier from the side of the antenna is detected with the directional coupler, and the supply of the power supply voltage applied to the power amplifier is interrupted when the level of the reflected wave is equal to or more than a predetermined value. Accordingly, it is possible to prevent the destruction of the power amplifier by the reflected wave without using a high-priced isolator.

Further, in a transmission circuit disclosed in Japanese Unexamined Patent Application Publication No. 2005-051349, an isolator is interposed between a power amplifier that receives a transmission signal and a transmission antenna, a bypass forming unit is provided between an input side and an output side of the isolator, and a power monitor circuit monitors the reflected power reflected by the transmission antenna. When the reflected power is equal to or below a reflected power reference value, a bypass control circuit closes the bypass forming unit (switch) to shunt the isolator. Meanwhile, when the reflected power exceeds the reflected power reference value, the bypass forming unit (switch) opens and the isolator is inserted between the power amplifier and the transmission antenna.

Further, a power amplifier disclosed in Japanese Unexamined Patent Application Publication No. 11-284522 includes a power amplifier unit that amplifies a high-frequency signal, a coupling unit that extracts a part of power sent from the power amplifier unit to an antenna, and an amplification controller that uses the extracted power for controlling the power amplifier unit. The power amplifier unit includes a coupler that connects each of a travelling wave and a reflected wave to the coupling unit, and controls attenuation or interruption of a transmission output of a transmission power amplifier or a transmission buffer amplifier using a voltage standing wave ratio calculated from travelling wave power and reflected wave power obtained from the coupler.

Next, the second technique will be described. FIG. 10 is a block diagram showing a microwave amplification device disclosed in Japanese Unexamined Patent Application Publication No. 06-152265. The microwave amplification device shown in FIG. 10 includes amplifier circuits 201 and 202, a power supply 204, a microwave transmission line 206, out-band signal detection circuits 207 and 208, and a control circuit 209. In the microwave amplification device shown in FIG. 10, the amplifier circuits 201 and 202 are controlled according to a control signal 205 using the control circuit 209, and the amplifier circuits 201 and 202 perform impedance conversion with the operation frequency bandwidth. When the microwave which is out of the operation frequency bandwidth is input, this is detected using the out-band signal detection circuits 207 and 208, and the control circuit 209 stops the operations of the amplifier circuits 201 and 202.

Further, a technique related to a transmission output control method is disclosed in Japanese Unexamined Patent Application Publication No. 2001-168740. A radio device according to Japanese Unexamined Patent Application Publication No. 2001-168740 includes a frequency conversion means that converts an intermediate frequency signal to a radio frequency signal, an amplifier means that amplifies the radio frequency signal to generate a transmission signal, and a power supply for amplification means that generates a power supply voltage for the amplification means. Further, the radio device includes a local oscillation means that generates a local oscillation signal of the frequency conversion means while stabilizing its frequency and detects frequency abnormality of the local oscillation signal, a device power supply means that supplies a power supply to in-device components, a device power supply output detection means that detects an output of a device power supply, and a transmission output control means that reduces the voltage of the power supply for amplification means or interrupts the power supply for amplification means upon detection of at least one of frequency abnormality and output abnormality of the device power supply.

A technique related to a transmission apparatus that prevents transmission of an unwanted wave due to abnormality of a local oscillator is disclosed in Japanese Unexamined Patent Application Publication No. 11-251935. FIG. 11 is a block diagram showing a transmission apparatus disclosed in Japanese Unexamined Patent Application Publication No. 11-251935. The transmission apparatus disclosed in Japanese Unexamined Patent Application Publication No. 11-251935 includes a frequency converter (MIX) 301, a local oscillator 302, a controller (CONT) 303, and a switch (SW) 304. The frequency converter (MIX) 301 outputs a high-frequency signal RF obtained by mixing an input signal IF and a local oscillation signal LO and converting the frequency. The local oscillator 302 outputs a local oscillation signal. The switch (SW) 304 is provided between the frequency converter 301 and the local oscillator 302, and prevents the local oscillation signal LO from being supplied to the frequency converter 301. The controller (CONT) 303 controls the switch 304 upon detection of abnormality in the local oscillator 302, so as to interrupt the local oscillation signal supplied to the frequency converter 301.

SUMMARY

In the techniques described in the background art, the power supply supplied to the power amplifier is interrupted or the power supplied to the power amplifier is reduced in order to prevent counterflow of the reflected wave and destruction of the power amplifier. At this time, when the time constant of the current path from the power supply circuit to the power amplifier is large, the power supplied to the power amplifier cannot be interrupted or reduced within a certain period of time in case of an abrupt change in the reflected wave, which makes it impossible to protect the power amplifier.

In view of the above problems, an object of the present invention is to provide a transmission apparatus and a method of controlling the same that are capable of properly protecting a power amplifier from a reflected wave.

A first exemplary aspect of the present invention is a transmission apparatus including: a baseband signal generator that generates a baseband signal; a local oscillator that oscillates local a oscillation frequency; a modulator that generates a modulation signal by multiplying the baseband signal by a carrier wave signal including the local oscillation frequency; a power amplifier that amplifies the modulation signal; a filter having a pass bandwidth that is narrower than a frequency bandwidth that can be set or emerge in the local oscillator and removes at least a part of unwanted component generated in association with the modulation signal that is amplified; and a frequency bandwidth inside/outside decision unit that decides that the local oscillation frequency is out of a predetermined bandwidth, in which the transmission apparatus controls one of the baseband signal generator and the local oscillator to reduce the modulation signal when it is decided by the frequency bandwidth inside/outside decision unit that the local oscillation frequency is out of the predetermined bandwidth.

A second exemplary aspect of the present invention is a method of controlling a transmission apparatus including a baseband signal generator that generates a baseband signal, a local oscillator that oscillates a local oscillation frequency, a modulator that generates a modulation signal by multiplying the baseband signal by a carrier wave signal including the local oscillation frequency, a power amplifier that amplifies the modulation signal, and a filter having a pass bandwidth that is narrower than a frequency bandwidth that can be set or emerge in the local oscillator and removes at least a part of unwanted component generated in association with the modulation signal that is amplified, in which one of the baseband signal generator and the local oscillator is controlled so as to reduce the modulation signal when the local oscillation frequency is out of a predetermined bandwidth.

The above and other objects, features and advantages of the present invention will become more fully understood from the detailed description given hereinbelow and the accompanying drawings which are given by way of illustration only, and thus are not to be considered as limiting the present invention.

BRIEF DESCRIPTION OF THE DRAWINGS

FIGS. 4A to 4D are timing charts for describing a second method to decide whether LO frequency is within a range of a predetermined frequency bandwidth in the transmission apparatus according to the second exemplary embodiment;

EXEMPLARY EMBODIMENT

First Exemplary Embodiment

Figure 1:
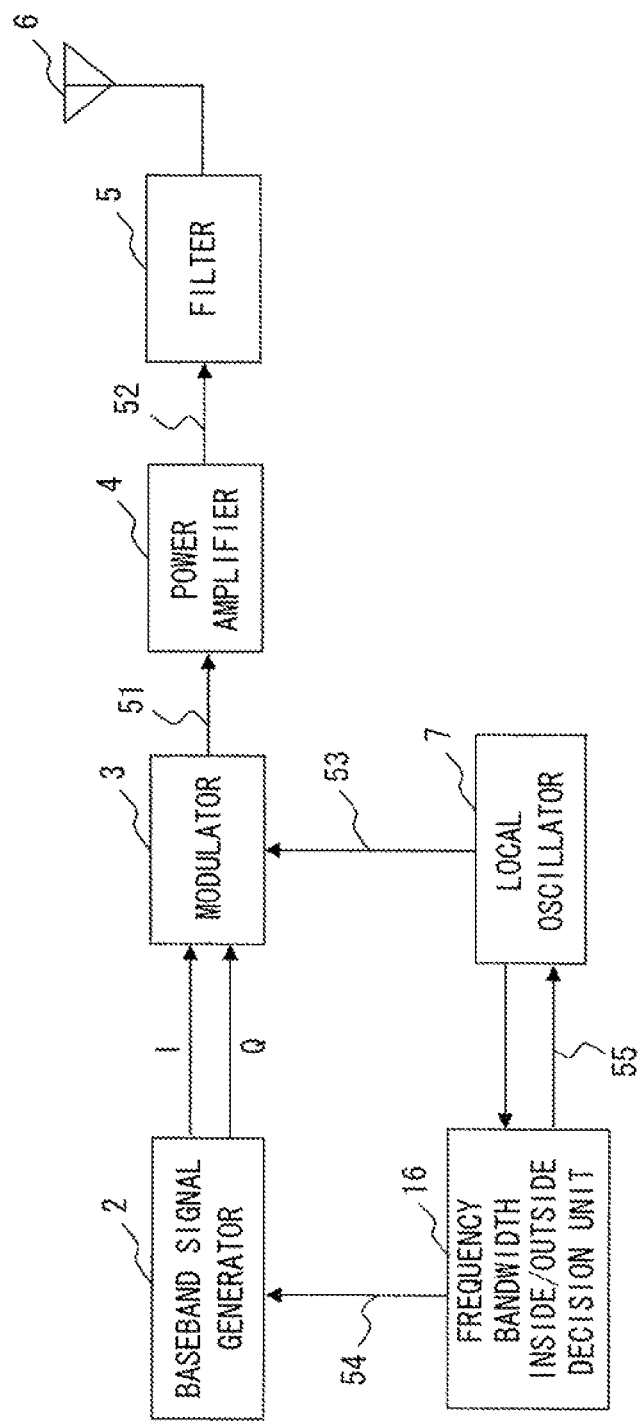
FIG. 1 is a block diagram showing a transmission apparatus according to a first exemplary embodiment of the present invention.

Hereinafter, exemplary embodiments of the present invention will be described with reference to the drawings. FIG. 1 is a block diagram showing a transmission apparatus according to a first exemplary embodiment of the present invention. The transmission apparatus shown in FIG. 1 includes a baseband signal generator 2, a modulator 3, a power amplifier 4, a filter 5, an antenna 6, a local oscillator 7, and a frequency bandwidth inside/outside decision unit 16.

The baseband signal generator 2 generates a baseband signal which is a transmission signal. Now, the transmission signal is a signal that should be transmitted such as voice or data, for example. The baseband signal is a signal having a signal waveform that is suitable for a modulation method used by a radio communication system. For example, the baseband signal generator 2 multiplies a signal to be transmitted by a spread code when using the CDMA (code division multiple access) method, and performs inverse FFT (inverse fast Fourier transform) when using the OFDM (orthogonal frequency division multiplexing) method. In the first exemplary embodiment, the baseband signal includes an in-phase component (I component) and a quadrature component (Q component).

The local oscillator 7 oscillates a local oscillation frequency. The modulator 3 receives the I component and the Q component of the baseband signal output from the baseband signal generator 2, and multiplies the baseband signal by an LO signal (carrier wave signal) 53 which is the local oscillation frequency, so as to generate a modulation signal 51.

The modulation signal 51 that is generated by the modulator 3 is supplied to the power amplifier 4. The power amplifier 4 amplifies the modulation signal 51, and outputs a modulation signal 52 that is amplified to the filter 5. The filter 5 has a pass bandwidth that is narrower than the frequency bandwidth that can be set or emerge in the local oscillator 7, and removes at least a part of unwanted component that is generated in association with the amplified modulation signal. The signal output from the filter 5 is transmitted to the antenna 6, from which the signal is transmitted.

Further, the frequency bandwidth inside/outside decision unit 16 decides whether the local oscillation frequency oscillated by the local oscillator 7 is within a predetermined bandwidth. The frequency bandwidth inside/outside decision unit 16 then generates a baseband signal generator control signal 54 that controls the baseband signal generator 2 according to the decision whether the local oscillation frequency is within the predetermined bandwidth, and outputs this signal to the baseband signal generator 2.

For example, when the local oscillation frequency oscillated at the local oscillator 7 is within the predetermined bandwidth, the baseband signal generator 2 generates a baseband signal according to the transmission signal. On the other hand, when the local oscillation frequency oscillated at the local oscillator 7 is out of the predetermined bandwidth, the baseband signal generator 2 adjusts the baseband signal to reduce the modulation signal 51.

Further, in the transmission apparatus according to the first exemplary embodiment, the local oscillator 7 may be controlled (for example, the power supply is turned off) when it is decided by the frequency bandwidth inside/outside decision unit 16 that the local oscillation frequency is out of the predetermined bandwidth, so as to reduce the modulation signal 51. In this case, the frequency bandwidth inside/outside decision unit 16 outputs a local oscillator control signal 55 that executes such control to the local oscillator 7.

Note that, the transmission apparatus according to the first exemplary embodiment may execute, when the local oscillation frequency is out of the predetermined bandwidth, control of the local oscillator 7 in addition to control of the baseband signal generator 2. Alternatively, the modulation signal 51 may be reduced only by the control of the local oscillator 7 (without using the baseband signal generator 2).

Further, when the baseband signal includes the I component and the Q component and it is decided by the frequency bandwidth inside/outside decision unit 16 that the local oscillation frequency is out of the predetermined bandwidth, the baseband signal generator 2 may set the I component and the Q component of the baseband signal to zero.

As described above, the transmission apparatus according to the first exemplary embodiment controls, when the local oscillation frequency oscillated at the local oscillator 7 is out of the predetermined bandwidth, the baseband signal generator 2 or the local oscillator 7 to reduce the modulation signal 51, thereby being capable of protecting the power amplifier 4. In summary, the modulation signal 51 is reduced by controlling the baseband signal generator 2 or the local oscillator 7 as described above, thereby being capable of reducing the reflected wave that is generated on the output side of the power amplifier 4 when the local oscillation frequency is out of the predetermined bandwidth.

Specifically, in the transmission apparatus according to the first exemplary embodiment, it is possible to reduce the time from when the local oscillation frequency becomes out of the predetermined bandwidth to when the modulation signal 51 is reduced by controlling the baseband signal generator 2.

The modulator 3 may further include a digital-analog converter that operates according to a clock signal of the local oscillation frequency (LO signal 53) and digital/analog converts the baseband signal. Then, when it is decided by the frequency bandwidth inside/outside decision unit 16 that the local oscillation frequency is out of the predetermined bandwidth, the modulation signal 51 may be reduced by stopping the clock supplied to the digital-analog converter by the local oscillator 7.

According to the transmission apparatus of the first exemplary embodiment described above, it is possible to provide a transmission apparatus that is capable of properly protecting a power amplifier from the reflected wave. Further, it is possible to suppress unwanted spurious radiation outside the specified frequency channel at the same time.

Second Exemplary Embodiment

Figure 2:
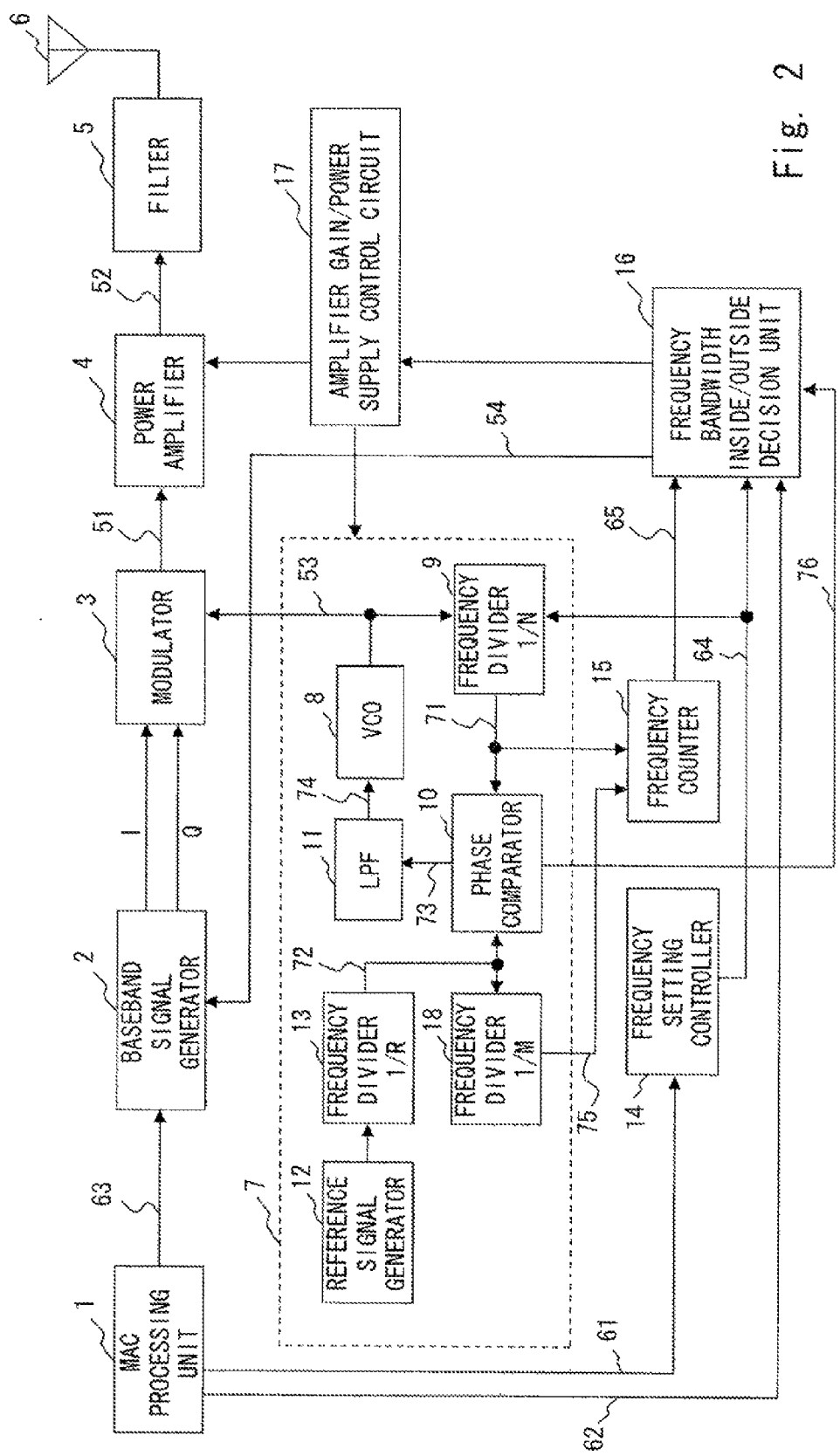
FIG. 2 is a block diagram showing a transmission apparatus according to a second exemplary embodiment of the present invention.

Next, a second exemplary embodiment of the present invention will be described. FIG. 2 is a block diagram showing a transmission apparatus according to the second exemplary embodiment of the present invention. The transmission apparatus shown in FIG. 2 includes a MAC (Media Access Control) processing unit 1, a baseband signal generator 2, a modulator 3, a power amplifier 4, a filter 5, an antenna 6, a local oscillator 7, a frequency setting controller 14, a frequency counter 15, a frequency bandwidth inside/outside decision unit 16, and an amplifier gain/power supply control circuit 17.

The MAC processing unit 1 performs access control in radio communication. For example, the MAC processing unit 1 adds control information to transmission data to output a transmission signal 63. Further, the MAC processing unit 1 outputs an RF transmission signal/channel frequency control command 61 to the frequency setting controller 14, and outputs RF frequency bandwidth information (RF frequency bandwidth information of the filter 5) 62 to the frequency bandwidth inside/outside decision unit 16.

The baseband signal generator 2 generates a baseband signal based on the transmission signal 63 output from the MAC processing unit 1. In summary, the baseband signal generator 2 performs primary modulation such as PSK (Phase-Shift Keying)/QAM (Quadrature Amplitude Modulation), and secondary modulation such as CDMA (Code Division Multiple Access)/OFDM (Orthogonal Frequency Division Multiplexing). Further, the baseband signal generator 2 performs coding, scrambling or the like on the information bit from the MAC 1 for error correction on the side of a receiver.

Then, in case of the CDMA system, for example, after the primary modulation such as PSK/QAM or the like is performed, the secondary modulation (spread modulation) by a spread code is performed. Further, in the case of the OFDM system, the information bit is dispersed into a plurality of sub-carrier groups by the primary modulation such as PSK/QAM and the plurality of sub-carrier groups are stored, and thereafter IFFT (Inverse Fast Fourier Transform) is performed to convert them to the time signals. Further, a copy of a guard interval is attached or zero padding processing is performed in order to prevent inter-symbol interference. Note that a complex baseband signal after being subjected to the primary modulation or the secondary modulation is decomposed into the I/Q quadrature baseband representation, and then output to the modulator 3.

In the direct conversion, for example, the modulator 3 multiplies and mixes each I/Q baseband signal by an LO (Local Oscillator) signal 53 (sine wave and cosine wave having phases perpendicular to each other by 90°) including the center frequency of the RF band modulation signal, so as to generate a modulation signal 51.

The power amplifier 4 amplifies the modulation signal 51 output from the modulator 3 to the transmission level. Further, the filter 5 has a pass bandwidth that is narrower than the frequency bandwidth that can be set or emerge in the local oscillator 7, and removes at least a part of unwanted component generated in association with a modulation signal 52 that is amplified. The unwanted component here is spurious emission or the like in the out-band area. The filter 5 may be a BPF (Band-pass filter), an LPF (Low-pass filter) or the like (may be a DUP for reception system coupling). The signal output from the filter 5 is transmitted to the antenna 6, from which a radio wave is emitted to the space.

The local oscillator 7 includes a PLL (Phase Locked Loop) circuit. The local oscillator 7 includes a reference signal generator 12, a frequency divider (1/R) 13, a frequency divider (1/M) 18, a phase comparator 10, an LPF 11, a voltage controlled oscillator (VCO) 8, and a frequency divider (1/N) 9.

The phase comparator 10 receives a comparison signal 71 which is to be controlled and a reference signal 72, and compares phases of these signals. The comparison signal 71 is obtained by dividing the frequency of the LO signal 53 output from the VCO 8 by the frequency divider 9, and the reference signal 72 is obtained by dividing the frequency of the signal output from the reference signal generator 12 by the frequency divider 13. The phase comparator 10 calculates the exclusive OR between the comparison signal 71 and the reference signal 72, so as to generate a rectangular voltage signal according to the phase difference between the comparison signal 71 and the reference signal 72. Then, by driving a Sink/Source current source of a charge pump circuit (not shown) provided in the output part of the phase comparator 10 based on the rectangular voltage signal, the charge pump circuit outputs a current 73 according to the phase difference to the LPF 11.

Then the current 73 output from the charge pump circuit is current-voltage converted by the LPF 11 and is smoothed, which generates a control signal 74. The control signal 74 is supplied to the VCO 8. At this time, the control signal 74 is fed back to the VCO 8. Thus the PLL circuit is a closed system.

In summary, the phase comparator 10 compares the phases of the comparison signal 71 and the reference signal 72, and allows a current to flow in or out from the charge pump circuit provided on the output side of the phase comparator 10 based on these phase difference for a period according to the phase difference. Now, the comparison signal 71 is a signal which is to be controlled in which the LO signal 53 of the VCO 8 is divided by the frequency divider 9 to around the phase comparison frequency (frequency of the reference signal generator 12/frequency division number of the frequency divider 13). Further, the reference signal 72 is a signal including a specific phase comparison frequency obtained by dividing the frequency of the signal of the reference signal generator 12 by the frequency divider 13.

Next, a case will be described where the channel frequency of the transmission signal 63 is set in the transmission apparatus according to the second exemplary embodiment.

When the RF transmission signal/channel frequency control command 61 is sent from the MAC processing unit 1 to the frequency setting controller 14, the frequency division number of the frequency divider 9 according to the LO frequency of the local oscillator 7 (or frequency of the LO signal 53, or in the second exemplary embodiment, RF center frequency) is determined by the frequency setting controller 14. The frequency setting controller 14 may be provided inside the MAC processing unit 1, for example. The frequency division number information 64 determined at the frequency setting controller 14 is output to the frequency bandwidth inside/outside decision unit 16 and the frequency divider 9 of the local oscillator 7. Then the output frequency of the VCO 8 converges to satisfy the following expression (1), and thus the PLL circuit is locked.

LO frequency (output frequency of the VCO 8 when the PLL is locked)=frequency of the reference signal generator 12/frequency division number of the frequency divider 13×frequency division number of the frequency divider 9=phase comparison frequency×frequency division number of the frequency divider 9     (1)

Although a single-looped PLL circuit has been described as an example in the second exemplary embodiment, the PLL circuit may have another configurations. Although the PLL circuit of Integer-N type with the integer value as the frequency division number has been described in the second exemplary embodiment, other PLL circuit, which is a PLL circuit of Fractional-N system (fractional frequency division system), may be used instead.

Described next is a first method to decide whether the LO frequency is within a range of the predetermined frequency bandwidth.

In this method, the comparison signal 71 (frequency of the VCO 8/frequency division number of the frequency divider 9) is sequentially monitored which is divided to a neighborhood of the phase comparison frequency of the local oscillator 7 (frequency of the reference signal generator 12/frequency division number of the frequency divider 13). Accordingly, it is possible to sequentially decide whether the LO signal 53, or the frequency of the RF transmission signal is within the predetermined bandwidth.

In summary, the transmission apparatus includes the frequency counter 15 that receives a reference signal 75 and the comparison signal 71. The reference signal 75 is obtained by dividing the frequency of the signal output from the reference signal generator 12 included in the local oscillator 7 by a predetermined frequency division number (R×M), and the comparison signal 71 is obtained by dividing the output signal from the local oscillator 7 (output 53 of the VCO) by a predetermined frequency division number (N). Then the frequency bandwidth inside/outside decision unit 16 decides whether the local oscillation frequency is out of the predetermined bandwidth based on the count number of the comparison signal 71 counted in a gate time determined based on the cycle of the reference signal 75. The first method will now be described in detail.

Figure 3:
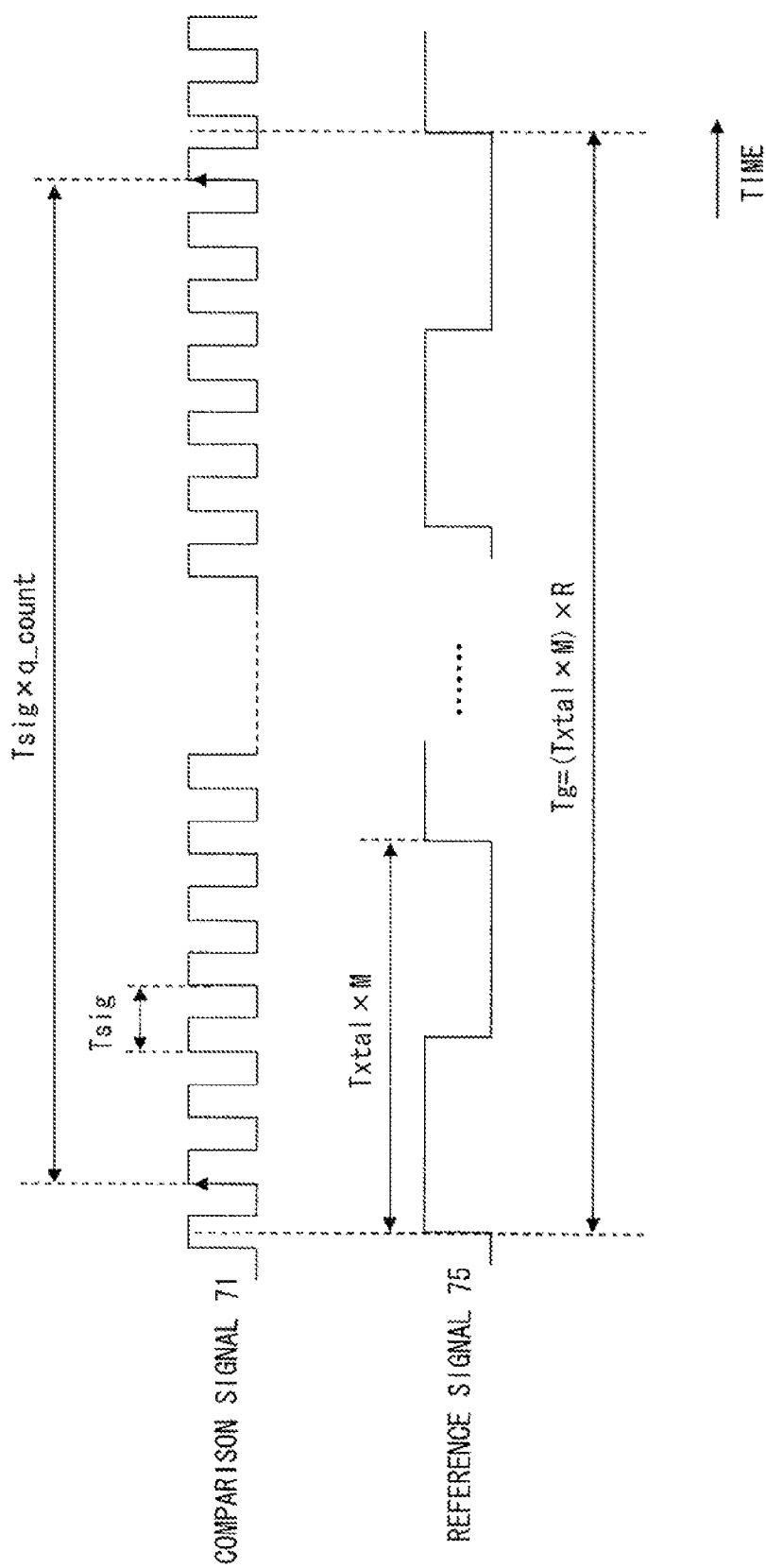
FIG. 3 is a timing chart for describing a first method to decide whether LO frequency is within a range of a predetermined frequency bandwidth in the transmission apparatus according to the second exemplary embodiment.

The comparison signal 71 which is the output of the frequency divider 9 is separated, and then output to the frequency counter 15. The frequency counter 15 counts the rising edge or the falling edge of the voltage waveform of the comparison signal 71, so as to identify the frequency after dividing the frequency of the signal by the frequency divider 9. FIG. 3 is a timing chart for describing a method of monitoring the LO frequency using the frequency counter 15.

In FIG. 3, the comparison signal 71 is a signal that is obtained by dividing the LO signal 53 by the frequency divider 9. Further, the reference signal 75 is a signal obtained by dividing (1/M) the reference signal 72 by the frequency divider 18. The reference signal 72 is a signal obtained by dividing (1/R) the signal output from the reference signal generator 12 by the frequency divider 13. Further, a gate time Tg corresponds to time R×M times as long as the cycle Txtal of the signal output from the reference signal generator 12. Then the frequency counter 15 counts the rising edge (or falling edge) of the comparison signal 71 in the gate time Tg (count number: q_count). When the cycle of the comparison signal 71 is denoted by Tsig, Tg>Tsig×q_count.

The frequency counter 15 then outputs a frequency measurement result 65 of the comparison signal 71 which is the output from the frequency divider 9 (q_count per Tg) to the frequency bandwidth inside/outside decision unit 16. The frequency bandwidth inside/outside decision unit 16 decides whether the LO frequency is within the predetermined frequency bandwidth based on the frequency measurement result 65.

In summary, the frequency bandwidth inside/outside decision unit 16 is able to estimate the frequency of the LO signal 53 (LO frequency) by multiplying the frequency measurement result output from the frequency counter 15 (q_count per Tg) 65 by the frequency division number N of the frequency divider 9 defined by the frequency setting controller 14 in advance (frequency division number control information), and dividing the multiplication result by the gate time Tg. In short, the LO frequency can be estimated from the relation shown in the expression (2) below.

The estimation value of the LO frequency=frequency measurement result of the comparison signal 71 which is the output of the frequency divider 9 measured by the frequency counter 15 ($q$_count)×frequency division number $N$ of the frequency divider 9 defined by the frequency setting controller 14 (frequency division number control information)/gate time $Tg$ (2)

Note that the following expression (3) is established from the relation of signals to be counted shown in FIG. 3. The expression (3) is used to obtain the above expression (2).

$T$sig×$q$_count=$Txtal$×$M$×$R$ $N$/fvco×q_count=1/$fxtal$×$M$×$R$ $$\text{fvco}=q\_count\times N\times fxtal/(M\times R)=q\_count\times N/(Txtal\times M\times R)=q\_count\times N/Tg \quad (3)$$

The parameters are set as follows:
frequency of VCO 8 (frequency of the LO signal 53): fvco;
output frequency of the frequency divider 9: fsig=fvco/N;
output cycle of the frequency divider 9: Tsig=1/fsig=N/fvco;
frequency of the signal output from the reference signal generator 12: fxtal;
cycle of the signal output from the reference signal generator 12: Txtal=1/fxtal;
frequency division number of the frequency divider 9: N;
frequency division number of the frequency divider 13: R; and
frequency division number of the frequency divider 18: M.

Note that the following expression is satisfied from phase comparison frequency=fxtal/R.

$$Tg=Txtal\times M\times R=M\times R/fxtal=M/\text{phase comparison frequency}=M\times\text{phase comparison cycle}$$

Accordingly, the gate time Tg is shortened by increasing the phase comparison frequency or reducing the frequency division number M of the frequency divider 18.

In the method above, the estimated value of the LO frequency is updated very time q_count is obtained for the gate time Tg. Accordingly, it is possible to obtain the estimation of the LO frequency in high speed as the gate time Tg is set shorter. If the frequency division number M of the frequency divider 18 is M=1 and the phase comparison frequency is 100 kHz in the Integer-N method, the detection time of the LO frequency is 1/100 kHz=10 μsec. Further, when the phase comparison frequency is set to 1 MHz, the detection time of the LO frequency is 1 μsec. However, when M=1, the count number (q_count) of the rising edge (or falling edge) of the comparison signal 71 per gate time Tg decreases, and the error of the estimation value of the LO frequency increases.

In order to improve the error, the frequency division number M of the frequency divider 18 needs to be increased. By increasing M, the count number of the comparison signal 71 per gate time Tg (q_count) is made M times larger, and the accuracy of the estimation value of the LO frequency is improved. However, the value of "M×phase comparison frequency" increases, which results in increased update time of the LO frequency.

As described above, the frequency bandwidth inside/outside decision unit 16 is able to decide whether the LO frequency is within the range of the frequency bandwidth set according to the RF frequency bandwidth information 62 output from the MAC processing unit 1.

Described next is a second method to decide whether the LO frequency is within a range of a predetermined frequency bandwidth.

In the second method, the local oscillator 7 includes the phase comparator 10 that receives the reference signal 72 and the comparison signal 71. The reference signal 72 is obtained by dividing the frequency of the signal from the reference signal generator 12 included in the local oscillator 7 by a predetermined frequency division number (R), and the comparison signal 71 is obtained by dividing the output signal of the local oscillator 7 by a predetermined frequency division number (N). Then it is decided whether the local oscillation frequency is out of the predetermined bandwidth based on the comparison result between the phase of the reference signal 72 and the phase of the comparison signal 71 in the phase comparator 10. The second method will be described in detail in the following description.

The phase comparator 10 included in the local oscillator 7 receives the comparison signal 71 obtained by dividing the LO signal 53 output from the VCO 8 by the frequency divider 9 and the reference signal 72 obtained by dividing the frequency of the signal output from the reference signal generator 12 by the frequency divider 13, and compares the phases of these signals. In the second method, when the comparison result in the phase comparator 10 is beyond the allowable phase difference, the phase comparator 10 outputs an alarm signal 76 that announces the PLL unlock to the frequency bandwidth inside/outside decision unit 16.

The alarm signal 76 is output in the transition state when the PLL power supply is turned on or off, in the transition state when the LO frequency is changed, or when the PLL is unlocked due to the occurrence of any abnormality, for example. In such cases, the phase of the pulse of the comparison signal 71 is greatly deviated from that of the reference signal 72. The deviation of these phases emerges prior to the deviation of the frequencies. Accordingly, by detecting the deviation of the phases, the frequency bandwidth inside/outside decision unit 16 is able to output the judgment result of the frequency bandwidth earlier.

FIG. 4 is a timing chart for describing the second method to decide whether the LO frequency is within a range of a predetermined frequency bandwidth. In FIGS. 4A to 4D, the left side shows a case in which the phase difference is small, and the right side shows a case in which the phase difference is large. In the examples shown in FIGS. 4A to 4D, the allowable phase difference is set to 30° (phase difference pulse width=about 1.7 nsec) as the judgment standard for judging whether the PLL is unlocked.

FIG. 4A shows waveforms of the reference signal 72 and the comparison signal 71. FIG. 4B shows a phase comparison result of exclusive OR operation between the reference signal 72 and the comparison signal 71. In FIG. 4B, the phase difference increases with increasing pulse width. FIG. 4C shows a state in which a predetermined delay is given to the pulse indicating the phase comparison result shown in FIG. 4B. The predetermined delay here is a delay corresponding to the allowable phase difference. For example, when the allowable phase difference is 30°, the delay value is 1.7 nsec. FIG. 4D shows the result of AND operation between the pulse shown in FIG. 4B and the pulse shown in FIG. 4C.

As shown in the left side of FIG. 4A, when the phase difference between the reference signal 72 and the comparison signal 71 is small (the phase difference of 18°, for example), the pulse width corresponding to the exclusive OR between the reference signal 72 and the comparison signal 71 is the phase difference of 18° (1 nsec) as shown in the left side of FIG. 4B. When the delay corresponding to the phase allowable degree of 30° (1.7 nsec) is given to the pulse, the result is as shown in the left side of FIG. 4C. Calculating the AND between the pulse shown in the left side of FIG. 4B and the pulse shown in the left side of FIG. 4C results in the left side of FIG. 4D. In this case, there is no pulse generated that indicates the alarm.

On the other hand, when the phase difference between the reference signal 72 and the comparison signal 71 is large (for example, the phase difference of) 90° as shown in the right side of FIG. 4A, the pulse width corresponding to the exclusive OR between the reference signal 72 and the comparison signal 71 is the phase difference of 90° (5 nsec) as shown in the right side of FIG. 4B. Giving a delay corresponding to the phase allowable degree of 30° (1.7 nsec) to the pulse results in the right side of FIG. 4C. Then, calculating the AND between the pulse shown in the right side of FIG. 4B and the pulse shown in the right side of FIG. 4C generates the pulse indicating the alarm as shown in the right side of FIG. 4D. In the second exemplary embodiment, the pulse shown in FIG. 4D is the alarm signal 76.

In summary, according to this method, the delay corresponding to the phase allowable degree is given to the pulse shown in FIG. 4B, and the AND operation is performed on the pulse before the delay is given and the pulse after the delay is given. Thus, when the pulse width (corresponding to phase difference) shown in FIG. 4B is larger than the phase allowable degree, the pulse before the delay is given overlaps with the pulse after the delay is given, which results in the emergence of the pulse indicating the alarm as the result of the AND operation.

For example, when the pulse shown in FIG. 4D is counted for a predetermined number of times or more, it can be judged as PLL unlocking. For example, when the predetermined number of times is set to once, the time to judge the PLL unlocking can be minimized. Although an increase in the predetermined number of times increases the time for judgment, it makes it possible to improve the accuracy to judge the PLL unlocking.

As described above, according to the transmission apparatus of the second exemplary embodiment, it is possible to decide whether the LO frequency is within a range of a predetermined frequency bandwidth using the two methods as above, for example. The method can be selected from the above two methods as appropriate based on the design requirements of a PLL circuit or other systems.

Described next is the control in a case in which the LO frequency is out of the range of the predetermined frequency bandwidth.

In the transmission apparatus according to the second exemplary embodiment, the transmission apparatus is controlled as follows when the LO frequency is out of the range of the predetermined frequency bandwidth, thereby being capable of protecting the power amplifier 4 from the reflected wave.

Specifically, when the LO frequency is out of the range of the predetermined frequency bandwidth, the frequency bandwidth inside/outside decision unit 16 instructs the baseband signal generator 2 to set each of an in-phase component (I component) and a quadrature component (Q component) of the baseband signal to zero. Thus, only the output of the modulator 3 (modulation signal 51) is the LO leak component (sine wave), and the effective value of the counterflow wave to the power amplifier 4 can be reduced instantaneously. The LO leak is a value obtained by adding the LO leak due to the DC offset output from the baseband signal generator 2 when the baseband signal is set to zero and the LO leak due to the feedthrough of the LO signal from an LO input port of the modulator 3 to an RF port of the modulator 3.

Further, the frequency bandwidth inside/outside decision unit 16 may instruct the amplifier gain/power supply control circuit 17 to turn off the power supply of at least one of the local oscillator 7 and the power amplifier 4, or to decrease the gain of the power amplifier 4. Further, the frequency bandwidth inside/outside decision unit 16 may instruct the amplifier gain/power supply control circuit 17 to reduce the power supply voltage of the power amplifier 4. Hereinafter, these operations will be described in detail.

Figure 5A:
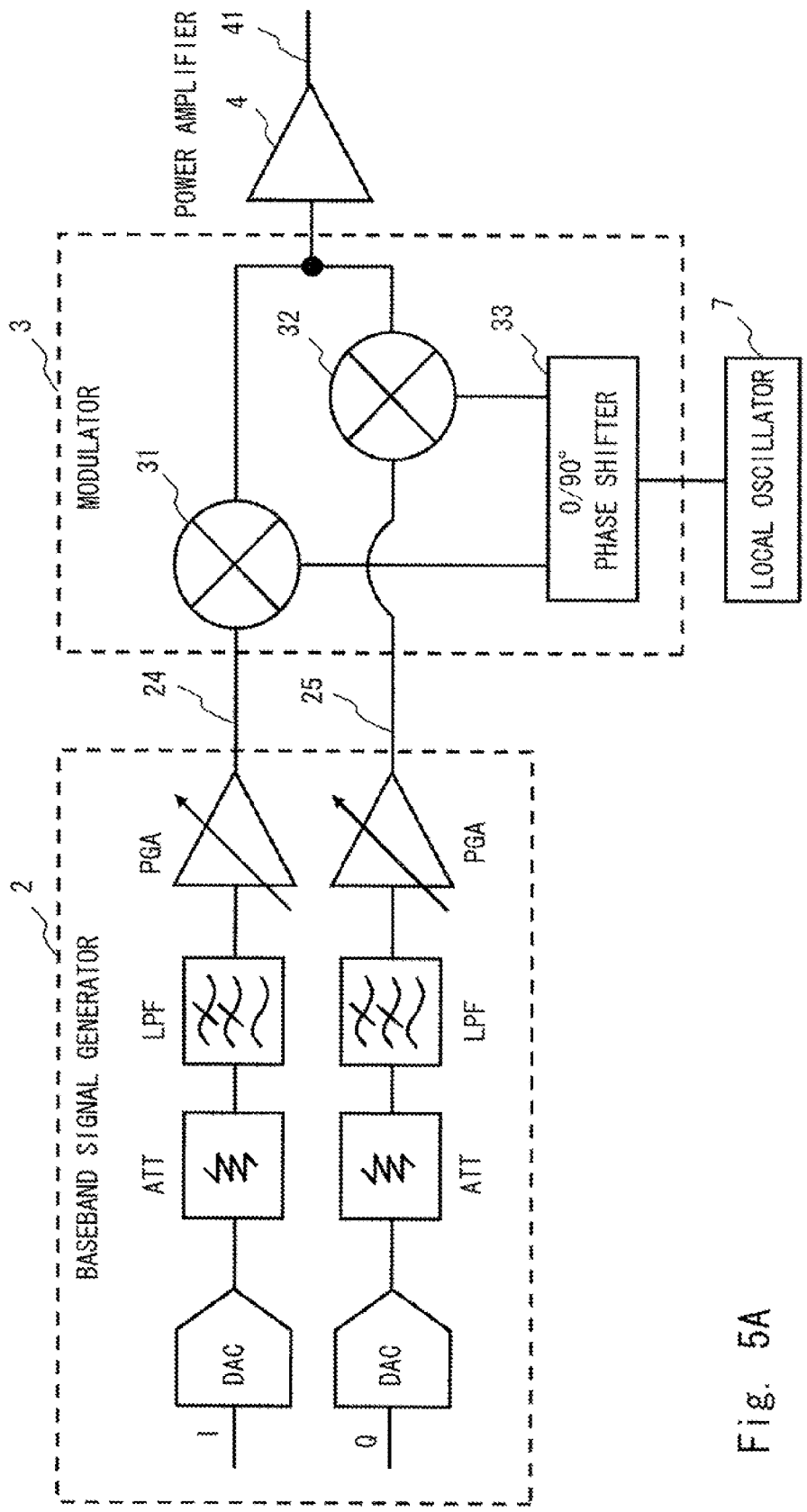
FIG. 5A is a diagram for describing an operation of the transmission apparatus according to the second exemplary embodiment, and describing detailed configurations of a baseband signal generator and a modulator.

FIG. 5A is a block diagram for describing detailed configurations of the baseband signal generator 2 and the modulator 3. As shown in FIG. 5A, the baseband signal generator 2 includes, in each of the path of the I component and the path of the Q component of the baseband signal, a DAC, an ATT, an LPF, and a programmable gain amplifier (PGA). Further, the modulator 3 includes a phase shifter 33 that shifts the phase of the LO signal generated by the local oscillator 7, and multipliers 31 and 32. The multiplier 31 multiplies the LO signal output from the phase shifter by the I component of the baseband signal output from the baseband signal generator 2. The multiplier 32 multiplies the LO signal output from the phase shifter by the Q component of the baseband signal output from the baseband signal generator 2. The output signals from the multiplier 31 and the multiplier 32 are vector-synthesized at the output part of the modulator 3, and then output to the power amplifier 4.

When the LO frequency is out of the range of the predetermined frequency bandwidth, the frequency bandwidth inside/outside decision unit 16 instructs the baseband signal generator 2 to set each of the I component and the Q component of the baseband signal to zero. Hence, an output 24 of the I component of the baseband signal generator 2 is only the DC offset of the I component of the baseband signal. Further, an output 25 of the Q component of the baseband signal generator 2 is only the DC offset of the Q component of the baseband signal. Now, the DC offset of the I component of the baseband signal corresponds to the difference of the DC voltages between I+ and I−, and the DC offset of the Q component corresponds to the difference of the DC voltages between Q+ and Q− in the differential circuit configuration.

Figure 5B:
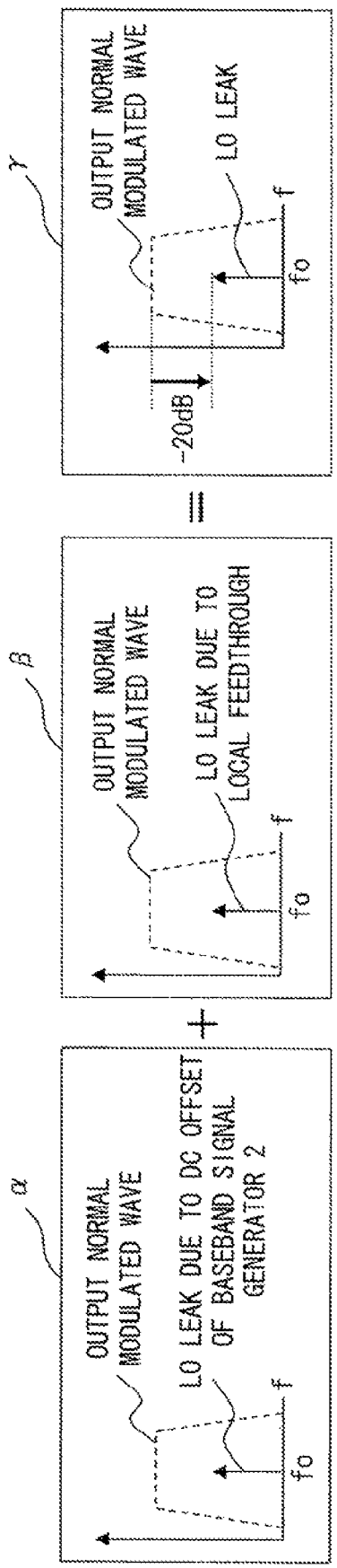
FIG. 5B is a diagram for describing an operation of the transmission apparatus according to the second exemplary embodiment, and describing LO leaks.

The DC offset of the I component and the Q component is vector-synthesized by the output part of the modulator 3, then amplified by the power amplifier 4, and is output from an output 41 of the power amplifier 4 as the LO leak (sine wave). The LO leak due to the DC offset output from the baseband signal generator 2 when the baseband signal is set to zero is shown by α of FIG. 5B. As shown in α of FIG. 5B, the LO leak α due to the DC offset of the baseband signal is a value that is lower than the normal modulation wave output.

Further, at this time, the LO leak is generated due to the feedthrough of the LO signal from the LO input port of the modulator 3 to the RF port of the modulator 3. The DC leak that is generated at this time is shown by β of FIG. 5B. As shown in β of FIG. 5B, the LO leak β due to the feedthrough is a value lower than the normal modulation wave output.

The LO leak α due to the DC offset of the baseband signal and the LO leak β due to the feedthrough are power-synthesized on the output side of the modulator 3. The DC leak after this synthesis is shown in γ of FIG. 5B. As shown in γ of FIG. 5B, the LO leak γ that is combined has a value lower than the normal modulation wave output (e.g., −20 dB). Hence, when the LO frequency is out of the range of the predetermined frequency bandwidth, each of the I component and the Q component of the baseband signal is set to zero, and thus the output of the modulator 3 is only the LO leak component (sine wave). Accordingly, it is possible to instantaneously reduce the effective value of the counterflow wave to the power amplifier 4. At the same time, the unwanted spurious radiation outside the specified frequency channel can also be suppressed:

The feedthrough of the LO signal from the LO input port of the modulator 3 to the RF port of the modulator 3 is the LO leak component that appears with reduction corresponding to isolation from the LO input port of the modulator 3 to the RF port of the modulator 3. In the differential circuit configuration, the feedthrough can be divided into the feedthrough component by a differential signal (Normal Mode) and that by an in-phase signal (Common Mode). Note that the in-phase signal (Common Mode) component is generated by the baseband signal generator 2, the modulator 3, and the local oscillator 7. As long as the modulator 3 and the power amplifier 4 have differential circuit configurations and the in-phase signal rejection ratio (CMRR: Common Mode Rejection Ratio) in the circuit part is sufficiently secured, the feedthrough component by the in-phase signal (Common Mode) can be suppressed.

Figure 6A:
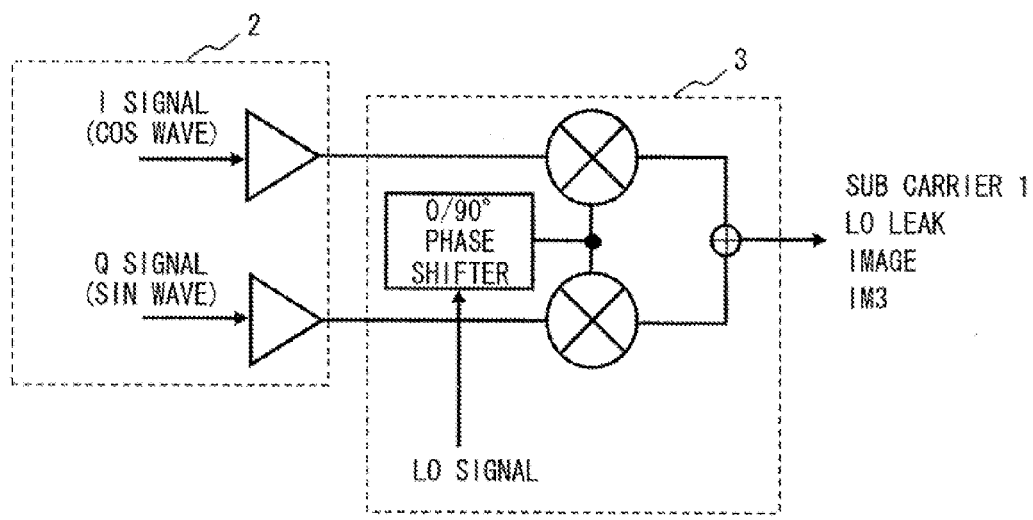
FIG. 6A is a diagram for describing an operation of the transmission apparatus according to the second exemplary embodiment, and describes detailed configurations of a baseband signal generator and a modulator.
Figure 6B:
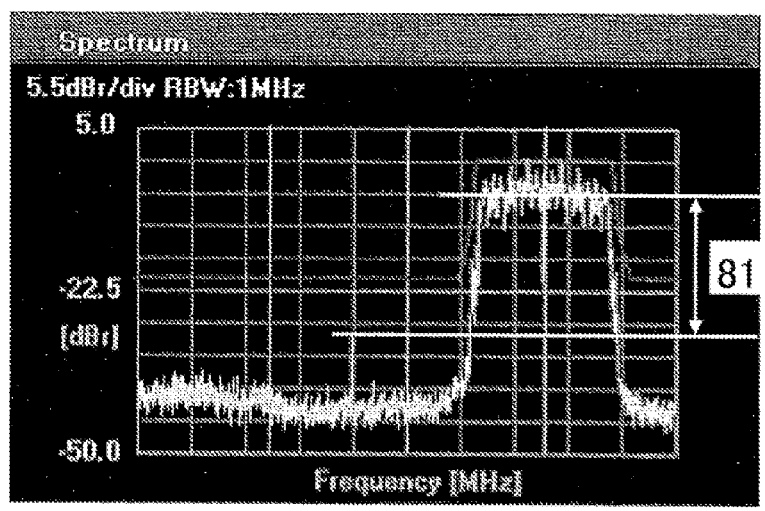
FIG. 6B is a diagram for describing an operation of the transmission apparatus according to the second exemplary embodiment, and describes a spectrum when a normal modulation is performed (right side) and an LO leak output (left side) when the LO frequency is set to an adjacent channel and modulation by a baseband signal is not performed.
Figure 7A:
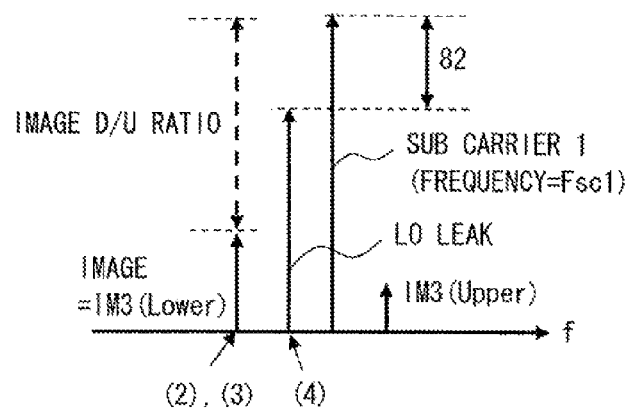
FIG. 7A is a diagram for describing an operation of the transmission apparatus according to the second exemplary embodiment, and shows a main modulation component (Sub Carrier 1), LO leak, Image, and IM3 output from the modulator.

Next, a relation of the D/U ratio between the effective value in the LO leak output and the effective value in the normal modulation output will be described with reference to FIGS. 6 and 7. In the example described below, as shown in FIG. 6A, the cosine wave is supplied to the I component of the baseband signal and the sine wave is supplied to the Q component of the baseband signal, and Sin/Cos modulation (SSB: Single Side Band) is performed. At this time, the main modulation component (Sub Carrier 1), the LO leak, Image, IM3 and the like are output from the modulator 3 (see FIG. 7A). Further, FIG. 6B shows an example of the spectrum when the normal modulation is performed (right side) and the output of the LO leak in the adjacent channel (left side). At this time, a D/U ratio (denoted by symbol 81) in the example shown in FIG. 6B corresponds to a D/U ratio (denoted by symbol 82) of the main modulation component output from the modulator 3 (Sub Carrier) to the LO leak shown in FIG. 7A.

When the Sin/Cos modulation is performed, the spurious due to the other modulation error factor also emerges in the output of the modulator 3. As shown in FIG. 7A, the spurious in which IM3 (Lower) and Image corresponding to the modulation accuracy are overlapped emerges in the frequency bandwidth which is in the lower side of the LO leak frequency. IM3 (Upper) is determined by the IM3 component by the combination of 2×LO leak frequency-Fsc1 (frequency of the Sub Carrier 1). Image D/U ratio is determined by a quadrature error such as an I/Q amplitude error or a phase error. In the frequency bandwidth which is in the upper side of the LO leak frequency, the spurious in which the fold-back part of Image and IM3 (Upper) are overlapped emerges. IM3 (Upper) is determined by the IM3 component by the combination of 2×Fsc1-LO leak frequency.

Figure 7B:
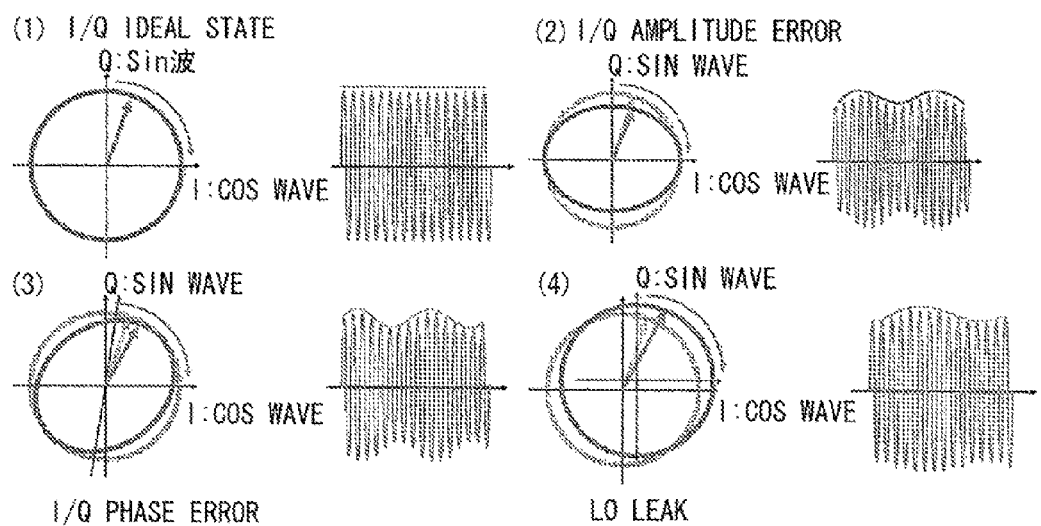
FIG. 7B is a diagram for describing an operation of the transmission apparatus according to the second exemplary embodiment, and shows Lissajous on the I/Q plane of signals (corresponding to synthesized signals such as Sub Carrier 1, LO leak, Image, IM3, etc.) output from a modulator when Sin/Cos modulation is performed.

Further, FIG. 7B shows output signals from the modulator 3 when the Sin/Cos modulation is performed (corresponding to synthesized signals of Sub Carrier 1, LO leak, Image, IM3, etc.) (1) when the I/Q is in the ideal state, (2) when the I/Q amplitude error occurs, (3) when the I/Q phase error occurs, and (4) Lissajous (Constellation) on the I/Q plane in the LO leak. At this time, (4) the origin of the Lissajous in the LO leak is offset, and the LO leak wave is output from the modulator 3 with the amplitude corresponding to the offset amount of the origin.

As described above, in the transmission apparatus according to the second exemplary embodiment, the transmission apparatus is controlled as stated above when the LO frequency is out of the range of the predetermined frequency bandwidth, thereby being capable of protecting the power amplifier 4 from the reflected wave. In particular, the power amplifier 4 can be protected more efficiently by applying such a control to a transmission apparatus of the CDMA modulation method or the OFDM modulation method which is the transmission modulation method with high peak.

In the transmission apparatus according to the second exemplary embodiment, immediately after the LO frequency is out of the range of the predetermined frequency bandwidth, the I/Q component of the baseband signal is set to zero from the normal CDMA/OFDM modulation, and the signal 52 output from the power amplifier 4 is the reflected wave due to only the LO leak. Hence, it is possible to reduce the amplitude probability density of the signal while prominently reducing the effective value of the reflected wave. For example, when the LO leak level when the I/Q zero modulation is performed is reduced by −20 dB from the effective value of the normal modulation wave (see FIGS. 5 to 7), the peak level of the reflected wave which is effective value +10 dB or more in the reflected wave in the normal modulation can be compressed to effective value −20 dB+3 dB (sine wave peak factor: 3 dB=20 Log($\sqrt{2}$))=effective value −17 dB. Accordingly, in terms of the improvement of the peak amplitude of the reflected wave voltage, it is possible to reduce the peak of the reflected wave by $10^{((-17 dB-10 dB)/20)}$=4.5%, which is quite prominent improvement.

Further, the level of the unwanted spurious radiation can be reduced from the normal spurious level in the situation deviated from the specified frequency channel to the LO leak level by the I/Q zero modulation, which means the spurious level of −20 dB in the effective value. Further, since obtained is a non-modulated spurious (line spectrum), superimposed interference in frequency to the adjacent channel bandwidth can also be mitigated.

On the other hand, when the frequency bandwidth inside/outside decision unit 16 decides that the LO frequency of the local oscillator 7 is within the bandwidth of the filter 5 or within the specified frequency channel, the control signal is sent from the frequency bandwidth inside/outside decision unit 16 to the baseband signal generator 2 so that the baseband signal generator 2 normally converts the information bit from the MAC processing unit 1 to the CDMA/OFDM modulation wave to generate the I/Q baseband signal.

As described above, when the LO frequency is out of the range of the predetermined frequency bandwidth, the frequency bandwidth inside/outside decision unit 16 instructs the baseband signal generator 2 to set the I/Q baseband signal to zero. Then, when the LO frequency is within the range of the predetermined frequency bandwidth again, the frequency bandwidth inside/outside decision unit 16 instructs the baseband signal generator 2 to output the normal I/Q baseband signal.

Further, in the transmission apparatus according to the second exemplary embodiment, when the LO frequency of the local oscillator 7 is out of the range of the predetermined frequency bandwidth, the frequency bandwidth inside/outside decision unit 16 may instruct the amplifier gain/power supply control circuit 17 to turn off a power supply of at least one of the local oscillator 7 and the power amplifier 4 or to reduce the gain of the power amplifier 4. Alternatively, the frequency bandwidth inside/outside decision unit 16 may instruct the amplifier gain/power supply control circuit 17 to reduce the power supply voltage of the power amplifier 4. For example, the frequency bandwidth inside/outside decision unit 16 may instruct the baseband signal generator 2 and also instruct the amplifier gain/power supply control circuit 17 to turn off the power supply of at least one of the local oscillator 7 and the power amplifier 4 or to reduce the gain of the power amplifier 4. When the power supply of the local oscillator 7 is turned off, the amplifier gain/power supply control circuit 17 instructs a power supply unit (not shown) of the local oscillator 7 to turn off the power supply of the local oscillator 7. Further, when the gain of the power amplifier 4 is to be reduced, the amplifier gain/power supply control circuit 17 instructs an attenuator or the like of the power amplifier 4 to reduce the gain of the power amplifier 4.

As described above, when the LO frequency of the local oscillator 7 is out of the range of the predetermined frequency bandwidth, each of the I component and the Q component of the baseband signal is set to zero and a power supply of at least one of the local oscillator 7 and the power amplifier 4 is turned off, or the gain of the power amplifier 4 is reduced, thereby being capable of protecting the power amplifier 4 from the reflected wave with more accuracy. Specifically, since there is no analog time constant included in the processing to set each of the I component and the Q component of the baseband signal to zero, the output of the modulator 3 can be attenuated in a short period of time.

The control to turn off the power supply of at least one of the local oscillator 7 and the power amplifier 4 or the control to decrease the gain of the power amplifier 4 require some time. However, by combining these types of control, the power amplifier 4 can be protected from the reflected wave with more accuracy. Further, the transmission apparatus according to the second exemplary embodiment is able to suppress unwanted spurious radiation.

In the transmission apparatus according to the related art, it is impossible to detect abnormality when there is no reflected wave generated within the filter bandwidth. However, according to the second exemplary embodiment of the present invention, when occurrence of adjacent channel interference cannot be allowed in terms of the system even within the filter bandwidth, it is possible to detect abnormality and to suppress unwanted spurious radiation.

The transmission apparatus according to the second exemplary embodiment of the present invention described above can be summarized as follows.

The following two methods can be used to decide whether the LO frequency is out of a predetermined frequency bandwidth according to the second exemplary embodiment.

(1-1) A method of sequentially monitoring the frequency after dividing the frequency of the reference signal output from the reference signal generator 12 of the local oscillator 7 (frequency of the reference signal 75) and the frequency after dividing the frequency of the LO signal 53 (frequency of the comparison signal 71) using the frequency counter 15.

(1-2) A method of outputting the alarm signal 76 that announces PLL unlocking to the frequency bandwidth inside/outside decision unit 16 when the comparison result in the phase comparator 10 of the local oscillator 7 is beyond the allowable phase difference.

Further, when the LO frequency is out of the range of the predetermined frequency bandwidth in the second exemplary embodiment, the transmission apparatus is controlled as follows, thereby being capable of protecting the power amplifier 4 from the reflected wave.

(2-1) The baseband signal generator 2 sets each of the in-phase component (I component) and the quadrature component (Q component) of the baseband signal to zero.

(2-2) The power supply of at least one of the local oscillator 7 and the power amplifier 4 is turned off. Alternatively, the gain of the power amplifier 4 is reduced.

The technique of protecting the power amplifier from the reflected wave as described in the background art has problems such as an increase in the cost or the size by inserting an isolator, incomplete measure to prevent counterflow of the reflected wave with peak (without readiness), or occurrence of unwanted spurious radiation due to the deviation of the specified frequency channel within the filter bandwidth.

The transmission apparatus according to the second exemplary embodiment judges that the LO frequency is outside the range of the predetermined frequency bandwidth by the means of the (2-1) and (2-2) described above and executes the control of the (2-1). Thus, the output of the modulator 3 is only the LO leak component (sine wave), the effective value of the counterflow wave that flows through the power amplifier 4 is instantaneously reduced, thereby solving the above problem. Then the control of (2-2) is executed in addition to the control of (2-1), thereby being capable of protecting the power amplifier 4 from the reflected wave with more accuracy. Further, unwanted spurious radiation can also be suppressed.

Third Exemplary Embodiment

Figure 8:
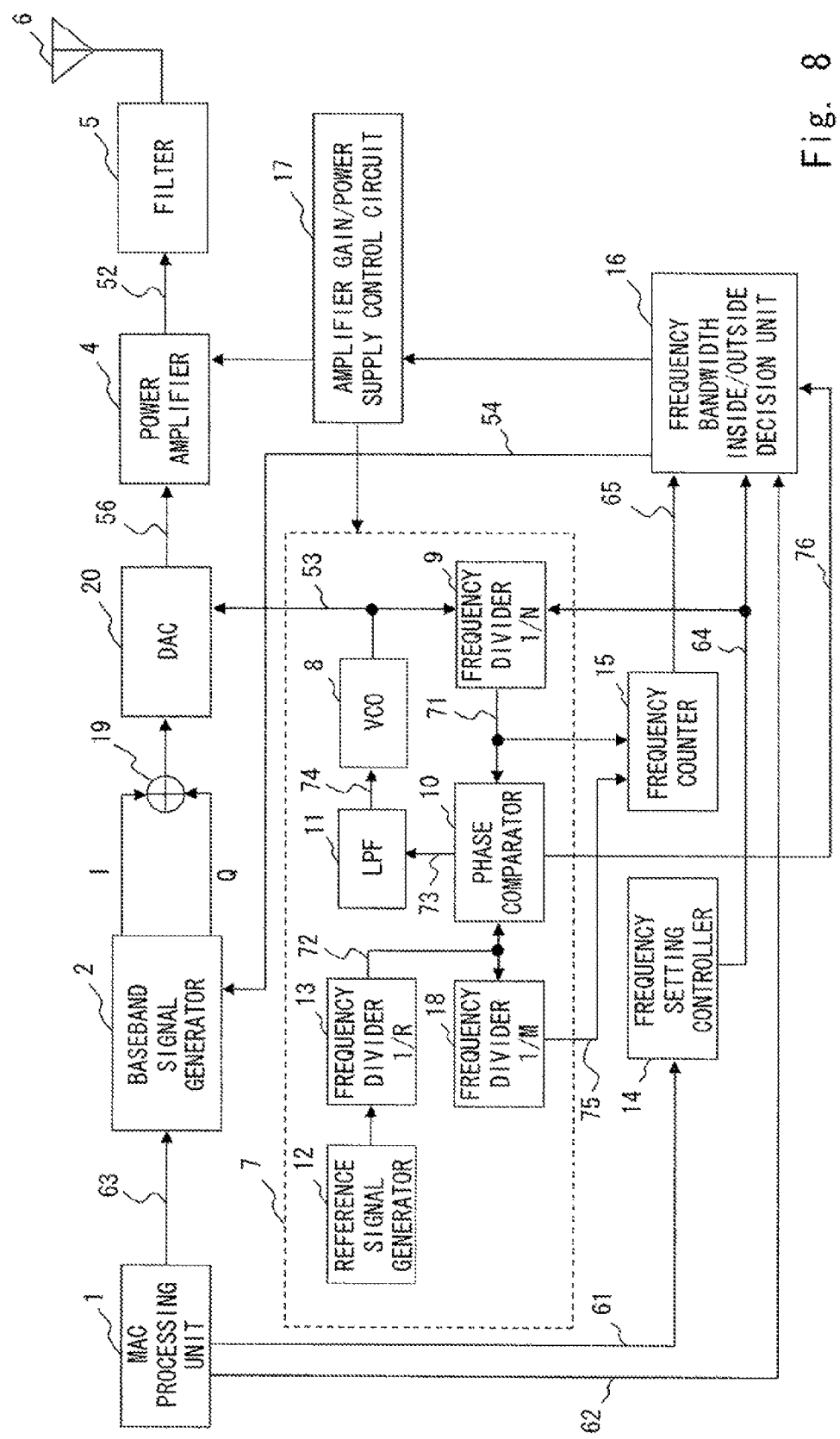
FIG. 8 is a block diagram showing a transmission apparatus according to a third exemplary embodiment.
Figure 9:
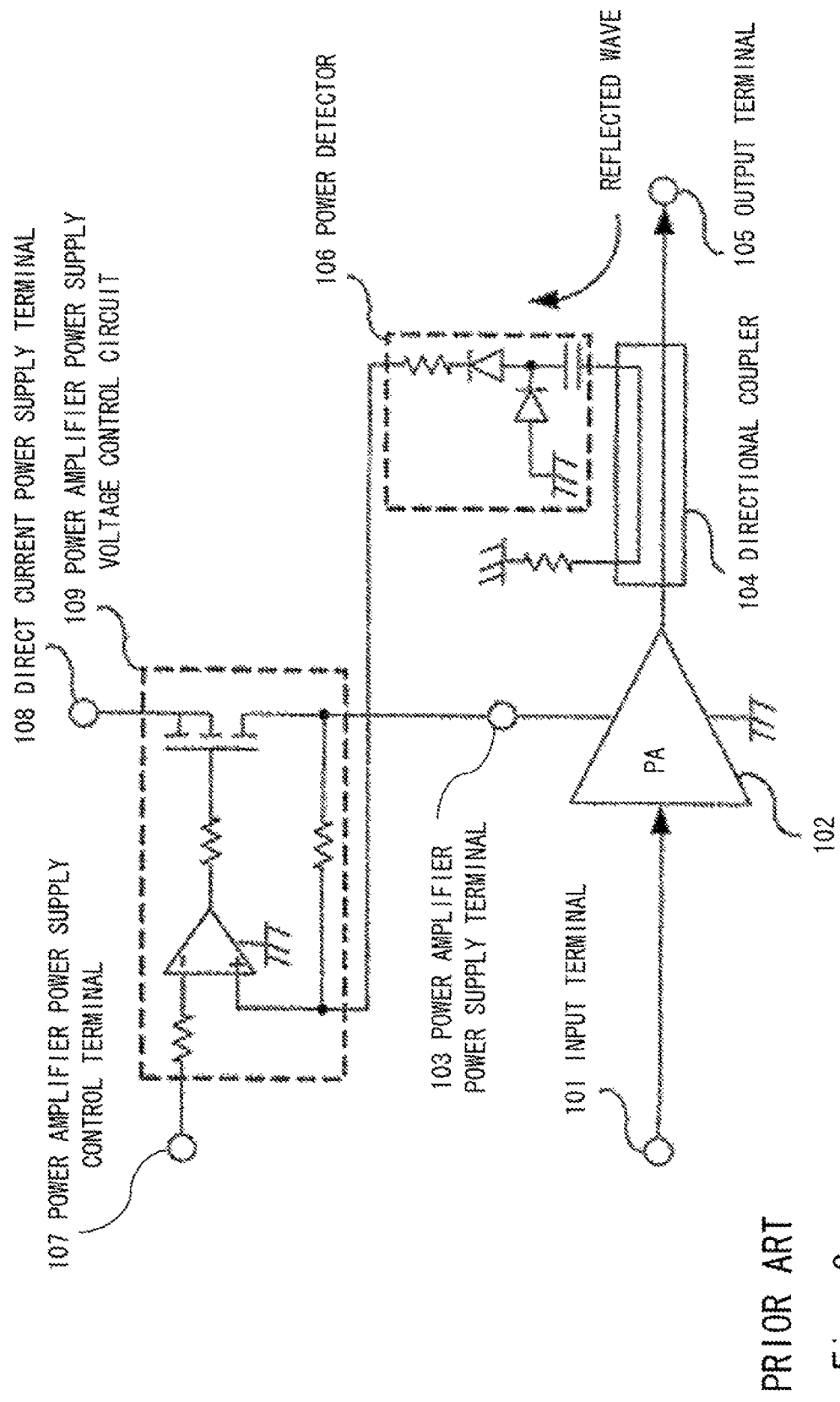
FIG. 9 is a circuit diagram showing a protection circuit of a power amplifier disclosed in Japanese Unexamined Patent Application Publication No. 2005-191791.
Figure 10:
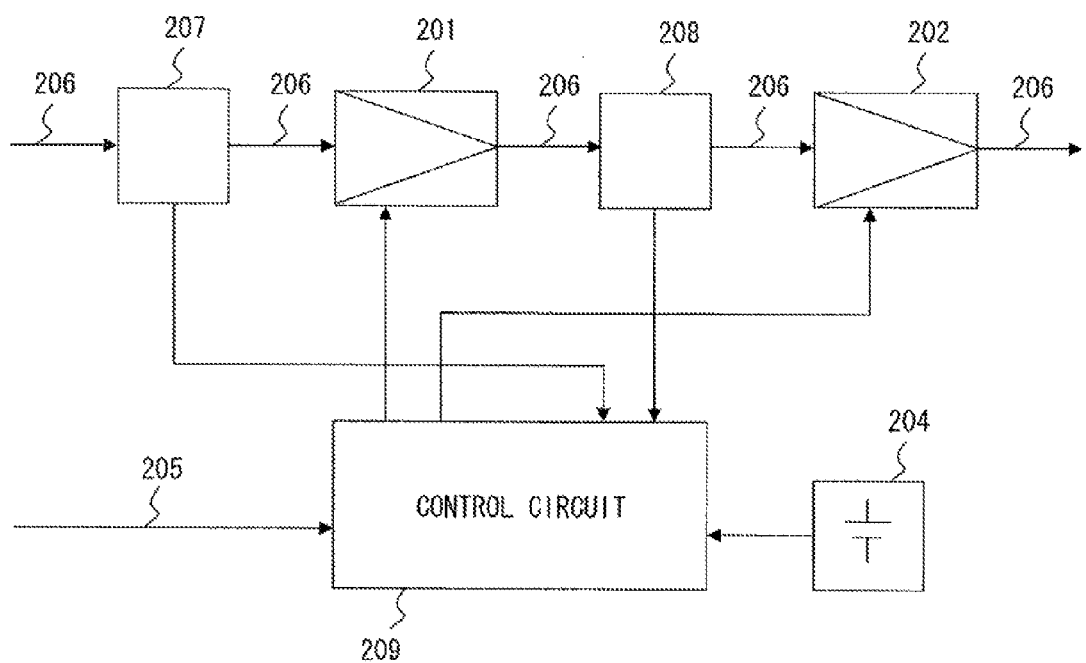
FIG. 10 is a block diagram showing a microwave amplification device disclosed in Japanese Unexamined Patent Application Publication No. 06-152265.
Figure 11:
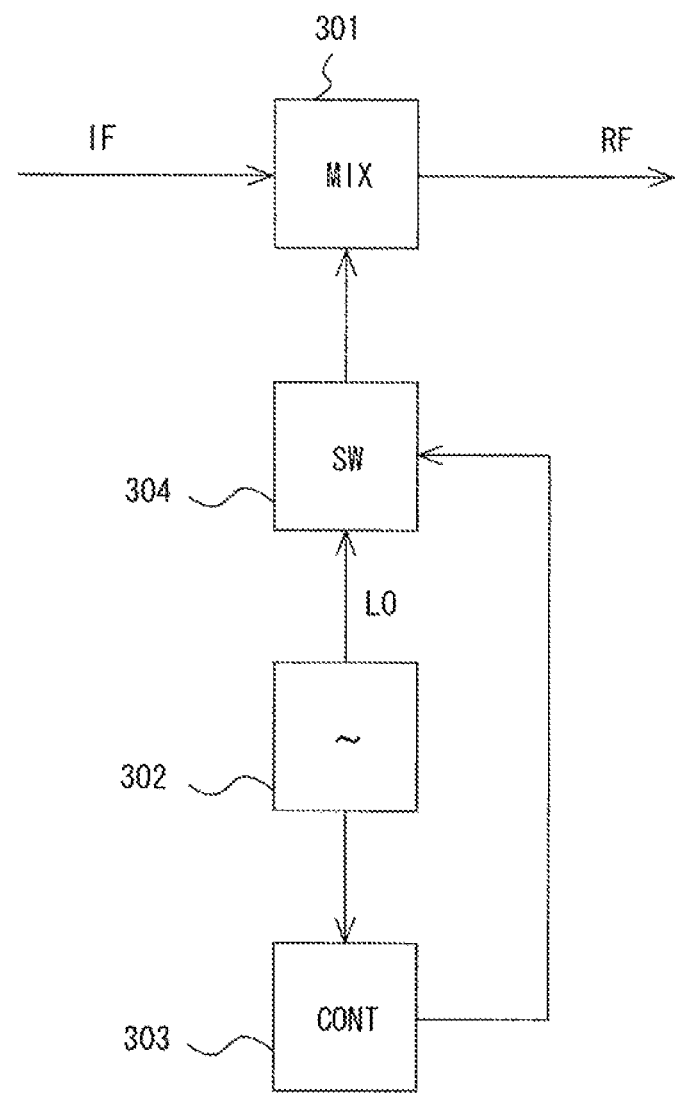
FIG. 11 is a block diagram showing a transmission apparatus disclosed in Japanese Unexamined Patent Application Publication No. 11-251935.

Next, a third exemplary embodiment of the present invention will be described. FIG. 8 is a block diagram showing a transmission apparatus according to the third exemplary embodiment of the present invention. The transmission apparatus shown in FIG. 8 is different from the transmission apparatus according to the second exemplary embodiment in that it includes a DAC 20 in place of the modulator 3 of the transmission apparatus according to the second exemplary embodiment shown in FIG. 2 and it includes an adder 19 that complex adds the I component and the Q component of the baseband signal. The same components as those shown in the transmission apparatus according to the second exemplary embodiment shown in FIG. 2 are denoted by the same reference symbols, and overlapping description will be omitted.

The baseband signal generator 2 generates a baseband signal based on the transmission signal 63 from the MAC processing unit 1. The baseband signal includes an I component and a Q component, and these signals are complex-synthesized (I+jQ) by the adder 19 and then output to the DAC 20.

The DAC 20 digital/analog converts the baseband signal after synthesis output from the adder according to the clock signal (LO signal) 53 output from the local oscillator 7, and outputs a converted signal 56 to the power amplifier 4.

In the third exemplary embodiment as well, the following two methods can be used to decide whether the LO frequency is out of the range of the predetermined frequency bandwidth.

(1-1) A method of sequentially monitoring the frequency after dividing the frequency of the reference signal output from the reference signal generator 12 of the local oscillator 7 (frequency of the reference signal 75) and the frequency after dividing the frequency of the LO signal 53 (frequency of the comparison signal 71) using the frequency counter 15.

(1-2) A method of outputting the alarm signal 76 that announces the PLL unlocking to the frequency bandwidth inside/outside decision unit 16 when the comparison result in the phase comparator 10 of the local oscillator 7 is beyond the allowable phase difference.

Further, in the third exemplary embodiment as well, the transmission apparatus is controlled as follows when the LO frequency is out of the range of the predetermined frequency bandwidth, thereby being capable of protecting the power amplifier 4 from the reflected wave.

(2-1) The baseband signal generator 2 sets each of the in-phase component and the quadrature component of the baseband signal to zero.

(2-2) The power supply of at least one of the local oscillator 7 and the power amplifier 4 is turned off. Alternatively the gain of the power amplifier 4 is reduced.

In particular, in the transmission apparatus according to the third exemplary embodiment, the power supply of the local oscillator 7 is turned off by the (2-2), thereby (2-3) stopping the clock signal (LO signal) 53 supplied to the DAC and turning off the transmission signals in the DAC and the following circuits. Hence, the signal 56 output from the DAC can be stopped. In this case as well, the amplifier gain/power supply control circuit 17 outputs the control signal to the controller of the local oscillator, thereby being capable of stopping the clock signal (LO signal) 53 supplied to the DAC.

By performing the control of (2-1) described above, only the output of the modulator 3 is the LO leak component (sine wave), and the effective value of the counterflow wave to the power amplifier 4 can be reduced instantaneously. Then by executing the control of (2-2) or (2-3) in addition to the control of (2-1), the transmission signals in the DAC and the following circuits can be made completely off, thereby being capable of protecting the power amplifier 4 from the reflected wave with more accuracy. Further, unwanted spurious radiation can be suppressed.

According to the present invention, it is possible to provide a transmission apparatus and a method of controlling the same which are capable of properly protecting a power amplifier from a reflected wave.

While the invention has been particularly shown and described with reference to exemplary embodiments thereof, the invention is not limited to these embodiments. It will be understood by those of ordinary skill in the art that various changes in form and details may be made therein without departing from the spirit and scope of the present invention as defined by the claims.

What is claimed is:

1. A transmission apparatus comprising:
   a baseband signal generator that generates a baseband signal;
   a local oscillator that oscillates a local oscillation frequency;
   a modulator that generates a modulation signal by multiplying the baseband signal by a carrier wave signal including the local oscillation frequency;
   a power amplifier that amplifies the modulation signal;
   a filter having a pass bandwidth that is narrower than a frequency bandwidth that can be set or emerge in the local oscillator and removes at least a part of unwanted component generated in association with the modulation signal that is amplified; and
   a frequency bandwidth inside/outside decision unit that decides that the local oscillation frequency is out of a predetermined bandwidth, wherein
   the transmission apparatus controls one of the baseband signal generator and the local oscillator to reduce the modulation signal when it is decided by the frequency bandwidth inside/outside decision unit that the local oscillation frequency is out of the predetermined bandwidth.

2. The transmission apparatus according to claim 1, wherein the baseband signal includes an in-phase component and a quadrature component, and
   the baseband signal generator sets each of the in-phase component and the quadrature component of the baseband signal to zero when it is decided by the frequency bandwidth inside/outside decision unit that the local oscillation frequency is out of the predetermined bandwidth.

3. The transmission apparatus according to claim 1, wherein the transmission apparatus turns off a power supply of at least one of the local oscillator and the power amplifier when it is decided by the frequency bandwidth inside/outside decision unit that the local oscillation frequency is out of the predetermined bandwidth.

4. The transmission apparatus according to claim 1, wherein the power amplifier reduces gain of the power amplifier when it is decided by the frequency bandwidth inside/outside decision unit that the local oscillation frequency is out of the predetermined bandwidth.

5. The transmission apparatus according to claim 1, wherein the modulator further comprises a digital-analog converter that operates according to a clock signal of the local oscillation frequency and digital/analog converts the baseband signal, and the local oscillator stops a clock supplied to the digital-analog converter when it is decided by the frequency bandwidth inside/outside decision unit that the local oscillation frequency is out of the predetermined bandwidth.

6. The transmission apparatus according to claim 1, wherein the frequency bandwidth inside/outside decision unit decides that the local oscillation frequency is out of the predetermined bandwidth when the local oscillation frequency of the local oscillator is out of the pass bandwidth of the filter, or when the local oscillation frequency of the local oscillator is out of a specified frequency channel.

7. The transmission apparatus according to claim 1, further comprising a frequency counter that receives a reference signal and a comparison signal, the reference signal being obtained by dividing a frequency of a signal from a reference signal generator included in the local oscillator by a predetermined frequency division number, the comparison signal being obtained by dividing a frequency of an output signal from the local oscillator by a predetermined frequency division number, wherein the frequency bandwidth inside/outside decision unit decides whether the local oscillation frequency is out of the predetermined bandwidth based on a count number of the comparison signal counted at gate time determined based on the reference signal.

8. The transmission apparatus according to claim 1, wherein the local oscillator comprises a phase comparator that receives a reference signal and a comparison signal, the reference signal being obtained by dividing a frequency of a signal output from a reference signal generator included in the local oscillator by a predetermined frequency division number, the comparison signal being obtained by dividing a frequency of an output signal of the local oscillator by a predetermined frequency division number, wherein it is decided whether the local oscillation frequency is out of the predetermined bandwidth based on the comparison result between a phase of the reference signal and a phase of the comparison signal by the phase comparator.

9. A method of controlling a transmission apparatus, the transmission apparatus comprising:

a baseband signal generator that generates a baseband signal;

a local oscillator that oscillates a local oscillation frequency;

a modulator that generates a modulation signal by multiplying the baseband signal by a carrier wave signal including the local oscillation frequency;

a power amplifier that amplifies the modulation signal; and a filter having a pass bandwidth that is narrower than a frequency bandwidth that can be set or emerge in the local oscillator and removes at least a part of unwanted component generated in association with the modulation signal that is amplified, the method comprising:

controlling one of the baseband signal generator and the local oscillator so as to reduce the modulation signal when the local oscillation frequency is out of a predetermined bandwidth.

10. The method of controlling the transmission apparatus according to claim 9, wherein the baseband signal comprises an in-phase component and a quadrature component, the method further comprising controlling the baseband signal generator to make each of the in-phase component and the quadrature component of the baseband signal zero when the local oscillation frequency is out of the predetermined bandwidth.

* * * * *